United States Patent
Yorita

(10) Patent No.: US 9,160,343 B2
(45) Date of Patent: Oct. 13, 2015

(54) HEATER DEVICE AND OSCILLATION APPARATUS

(71) Applicant: NIHON DEMPA KOGYO CO., LTD., Tokyo (JP)

(72) Inventor: Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 16 days.

(21) Appl. No.: 14/079,641

(22) Filed: Nov. 14, 2013

(65) Prior Publication Data

US 2014/0132361 A1   May 15, 2014

(30) Foreign Application Priority Data

Nov. 15, 2012   (JP) ................................ 2012-251613

(51) Int. Cl.
  *H03L 1/00*   (2006.01)
  *H03L 1/02*   (2006.01)
  *H05B 1/02*   (2006.01)
  *H03B 5/32*   (2006.01)
  *H03B 5/36*   (2006.01)
  *H03L 1/04*   (2006.01)
  *H03L 7/00*   (2006.01)
  *H03L 7/07*   (2006.01)

(52) U.S. Cl.
  CPC  *H03L 1/028* (2013.01); *H03B 5/32* (2013.01); *H03B 5/36* (2013.01); *H03L 1/04* (2013.01); *H05B 1/023* (2013.01); *H03L 7/00* (2013.01); *H03L 7/07* (2013.01)

(58) Field of Classification Search
  CPC ......... H03L 1/022; H03L 1/028; H03L 1/025; H03L 1/026; H03L 7/18; H03L 1/023; H03L 1/027; H03L 1/04; H03B 5/32; H03B 5/36
  USPC ....... 331/158, 116 FE, 116 R, 176; 361/93.8, 361/106
  See application file for complete search history.

(56) References Cited

U.S. PATENT DOCUMENTS 5,041,800 A *  8/1991  Long et al. ...................... 331/69
2003/0184399 A1 * 10/2003  Lanoue et al. ................. 331/176

FOREIGN PATENT DOCUMENTS

| JP | 2001-251141 | 9/2001 |
| JP | 2012-170050 | 9/2012 |
| JP | 2013-051676 | 3/2013 |
| JP | 2013-051677 | 3/2013 |
| JP | 2013-098865 | 5/2013 |
| JP | 2013-143601 | 7/2013 |

* cited by examiner

*Primary Examiner* — Arnold Kinkead

(74) *Attorney, Agent, or Firm* — Jianq Chyun IP Office

(57) ABSTRACT

A heater device includes a temperature detector, a heater control circuit, a heater, a voltage supply path, and an overheat prevention circuit. The overheat prevention circuit includes a positive-temperature-coefficient thermistor and a pull-up resistor. The positive-temperature-coefficient thermistor is interposed on the voltage supply path in a position for being heated by the heater. The pull-up resistor that includes: one end connected between the heater and the positive-temperature-coefficient thermistor, and another end connected to a direct current power source. The control voltage to be applied to the heater is restricted to a voltage at a connection point between the positive-temperature-coefficient thermistor and the pull-up resistor when the control voltage from the heater control circuit is abnormally decreased.

8 Claims, 8 Drawing Sheets

HEATER DEVICE AND OSCILLATION APPARATUS

CROSS REFERENCE TO RELATED APPLICATIONS

This application claims the priority benefit of Japan application serial no. 2012-251613, filed on Nov. 15, 2012. The entirety of the above-mentioned patent application is hereby incorporated by reference herein and made a part of this specification.

TECHNICAL FIELD

This disclosure relates to a technique that prevents overheating of a heater when a value of a control voltage becomes abnormal in a heater device, and the heater device includes the heater whose heat generation is controlled with the control voltage from a heater control circuit.

DESCRIPTION OF THE RELATED ART

As one example of a heater device that includes a heater whose heat generation is controlled with a control voltage from a heater control circuit, a heater device incorporated in an oven-controlled crystal oscillator (OCXO) is illustrated. The OCXO is constituted such that a crystal unit and a heater are disposed within a container, so as to reduce variation in oscillation frequency of the crystal unit due to temperature change. For example, a known configuration includes a heater and a thermistor as a temperature detector in an analog circuit. (see FIG. 1 and paragraph 0014 of Japanese Unexamined Patent Application Publication No. 2001-251141).

On the other hand, in order to further improve the stability of the oscillation frequency of the crystal unit, the inventor focused on the fact that a differential signal corresponding to difference in oscillation frequency of two crystal units has a linear relationship with temperature. The inventor examined a method for integrating the difference between the differential signal and a signal corresponding to a target temperature, so as to obtain the control voltage of the heater (see FIG. 1 and paragraph 0014 of Japanese Unexamined Patent Application Publication No. 2012-170050). In this method, the operation of the differential signal and the generation of the control voltage are performed by an integrated circuit chip such as an LSI, so as to ensure reduction in size. This method is expedient in that respect.

However, for example, in the case where a heater control is performed with a negative control characteristic in which the supply power of the heater becomes smaller as the control voltage becomes larger, an abnormal drop (for example, to zero) in control voltage due to LSI failure or solder defect may maximize the heater electric power. This may thermally destroy the equipment. Also, in the case where a heater control is performed with a positive control characteristic in which the supply power of the heater becomes larger as the control voltage becomes larger, a similar problem occurs.

For example, although it is possible to dispose an external logic circuit that detects a temperature for protection, it is difficult to constitute the circuit for high temperatures. If this logic circuit operates normally, the circuit size becomes large. Accordingly, it is difficult to put the logic circuit within a container as an exterior body of electronic equipment and the price becomes higher. A drawback with a method using a thermal fuse is that usage lifetime is short under higher temperatures in which the atmosphere temperature is, for example, 70 degrees.

A need thus exists for a heater device which is not susceptible to the drawback mentioned above.

SUMMARY

A heater device of this disclosure includes a temperature detector, a heater control circuit, a heater, a voltage supply path, and an overheat prevention circuit.

The temperature detector is configured to detect a temperature of a temperature-controlled object. The heater control circuit is configured to output a control voltage based on a temperature detection value of the temperature detector, and a temperature target value. The heater is configured to cause heat generation by supply of the control voltage from the heater control circuit, and to provide higher output as the control voltage decreases, so as to heat the temperature of the temperature-controlled object to the target temperature. The voltage supply path is configured to supply the control voltage to the heater. The overheat prevention circuit is configured to prevent excessive heat generation of the heater when the heater control circuit becomes abnormal. The overheat prevention circuit includes a positive-temperature-coefficient thermistor and a pull-up resistor. The positive-temperature-coefficient thermistor is interposed in the voltage supply path in a position heated by the heater. The pull-up resistor includes one end connected between the heater and the positive-temperature-coefficient thermistor, and another end connected to a direct current power source. The control voltage to be applied to the heater is restricted to a voltage at a connection point between the positive-temperature-coefficient thermistor and the pull-up resistor when the control voltage from the heater control circuit abnormally decreases.

Another heater device of this disclosure includes a temperature detector, a heater control circuit, a heater, a voltage supply path, and an overheat prevention circuit. The temperature detector is configured to detect a temperature of a temperature-controlled object. The heater control circuit is configured to output a control voltage based on a temperature detection value of the temperature detector, and a temperature target value. The heater is configured to cause heat generation by supply of the control voltage from the heater control circuit, and to provide higher output as the control voltage increases, so as to heat the temperature of the temperature-controlled object to the target temperature. The voltage supply path is configured to supply the control voltage to the heater. The overheat prevention circuit is configured to prevent excessive heat generation of the heater when the heater control circuit becomes abnormal. The overheat prevention circuit includes a positive-temperature-coefficient thermistor and a pull-down resistor. The positive-temperature-coefficient thermistor is interposed in the voltage supply path in a position heated by the heater. The pull-down resistor that includes one end connected between the heater and the positive-temperature-coefficient thermistor, and another end that is grounded. The control voltage to be applied to the heater is restricted to a voltage at a connection point between the positive-temperature-coefficient thermistor and the pull-down resistor when the control voltage from the heater control circuit excessively increases.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

First Embodiment

Figure 1:
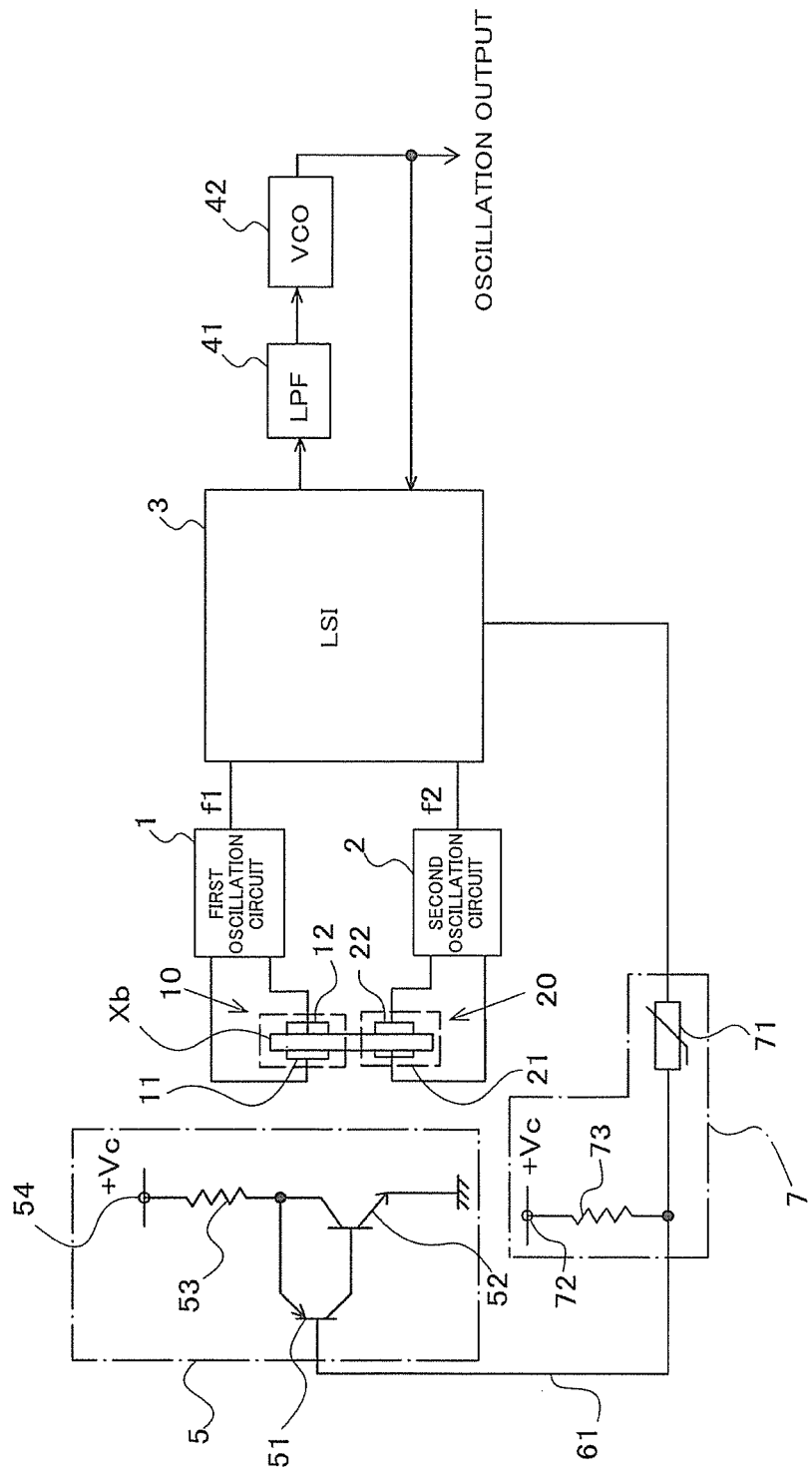
FIG. 1 is a block diagram illustrating the whole of a first embodiment where a heater device disclosed here is applied to an oscillation apparatus.

FIG. 1 illustrates a first embodiment where a heater device of this disclosure is applied to an oscillation apparatus. This oscillation apparatus is constituted as a frequency synthesizer that outputs a frequency signal with a set frequency. The overall configuration of the oscillation apparatus will be briefly described. The oscillation apparatus includes a first crystal unit 10 and a second crystal unit 20. The first crystal unit 10 and the second crystal unit 20 are constituted using a crystal element Xb in common. That is, for example, a strip-shaped area of the crystal element Xb is divided into two in a longitudinal direction, and respective electrodes for excitation are disposed on both front and back surfaces of each divided area (vibration area). Accordingly, the first crystal unit 10 is constituted of one divided area and a pair of electrodes 11 and 12. The second crystal unit 20 is constituted of the other divided area and a pair of electrodes 21 and 22.

Figure 2:
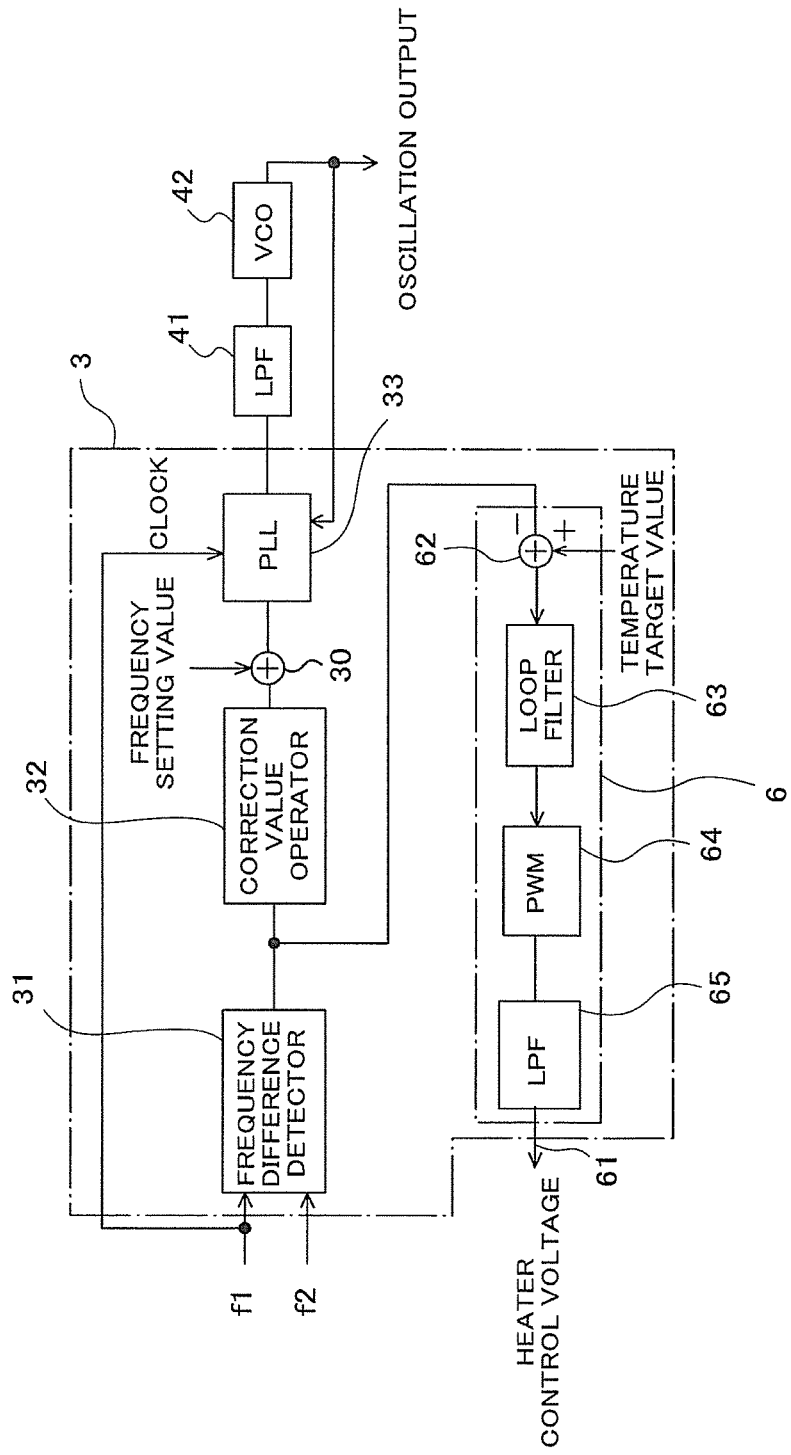
FIG. 2 is a circuit diagram illustrating a detailed circuit configuration of a main part of the first embodiment.

The first crystal unit 10 and the second crystal unit 20 respectively connect to a first oscillation circuit 1 and a second oscillation circuit 2. Reference numeral 3 denotes an LSI that is an integrated circuit chip (an IC chip). In the IC chip 3, as illustrated in FIG. 2, a frequency difference detector 31, a correction value operator 32, and a PLL circuit section 33 are disposed. The output side of the PLL circuit section 33 connects to a low-pass filter (LPF) 41 and a voltage control oscillator (VCO) 42. The output of the voltage control oscillator (VCO) 42 corresponds to the oscillation output of the oscillation apparatus. This oscillation output is fed back to the PLL circuit section 33.

The PLL circuit section 33 uses the oscillation output from the first oscillation circuit 1 as a clock signal to convert a signal corresponding to a phase difference into an analog signal, and the phase difference is between a pulse signal generated based on a frequency setting signal with a digital value and a feedback pulse from the voltage control oscillator (VCO) 42. The PLL circuit section 33 integrates this analog signal and outputs the result to the low-pass filter 41. The frequency setting signal has a value obtained by addition of a frequency setting value and a correction value from the correction value operator 32 at an addition unit 30. This correction value is a value for compensating a change amount when the temperature of the first crystal unit 10 changes from a target temperature, that is, a temperature change amount of the clock signal.

A value corresponding to a frequency difference f1-f2 corresponds to a temperature of the atmosphere where the crystal units 10 and 20 are placed (as a temperature detection value), and the frequency difference f1-f2 is between an oscillation output f1 from the first oscillation circuit 1 and an oscillation output f2 from the second oscillation circuit 2. For convenience of explanation, reference numerals f1 and f2 also denote respective oscillation frequencies of the first oscillation circuit 1 and the second oscillation circuit 2. In this example, the frequency difference detector 31 extracts a value of $\{(f2-f1)/f1\}-\{(f2r-f1r)/f1r\}$. This value corresponds to the temperature detection value in a proportional relationship to temperature. Respective reference numerals f1r and f2r denote the oscillation frequency of the first oscillation circuit 1 and the oscillation frequency of the second oscillation circuit 2 at a reference temperature of, for example, 25° C.

The correction value operator 32 calculates a frequency correction value based on the temperature detection value and a preliminarily created relationship between the temperature detection value and the frequency correction value. Additionally, the temperature detection value is used, as described later, for a heat generation control of a heater 5 to keep the crystal units 10 and 20 at the target temperature. Therefore, the oscillation apparatus of this embodiment is what is called an integrated apparatus of an oven-controlled crystal oscillator (OCXO) and a temperature-controlled crystal oscillator (TCXO).

Figure 3:
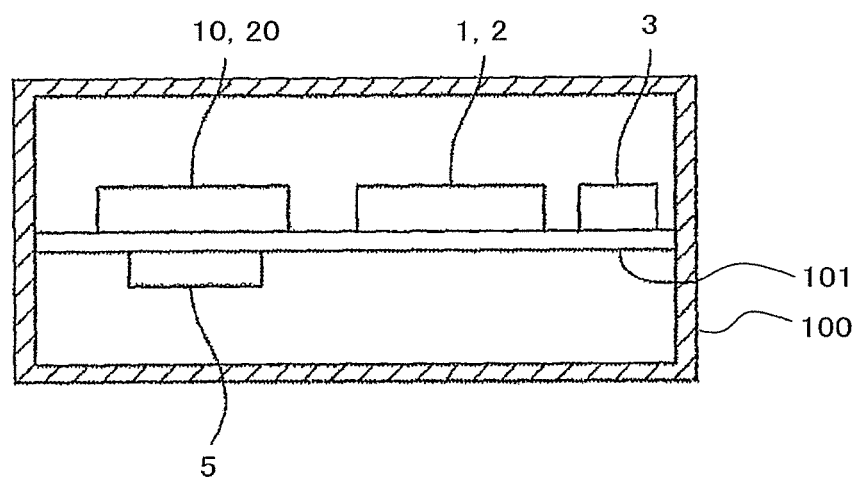
FIG. 3 is a cross-sectional view illustrating an exemplary configuration structure of components in the first embodiment.

The heater 5 is disposed within a container that houses the crystal units 10 and 20, and has a function for heating the atmosphere within the container (the crystal units 10 and 20), which is a temperature-controlled object, to the target temperature. FIG. 3 is a cross-sectional view illustrating one example of this embodiment. The crystal units 10 and 20, the oscillation circuits 1 and 2, and the IC chip 3 are disposed on the top surface side of a printed circuit board 101 arranged within a container 100. On the inferior surface side of the printed circuit board 101, the heater 5 is disposed.

Figure 4:
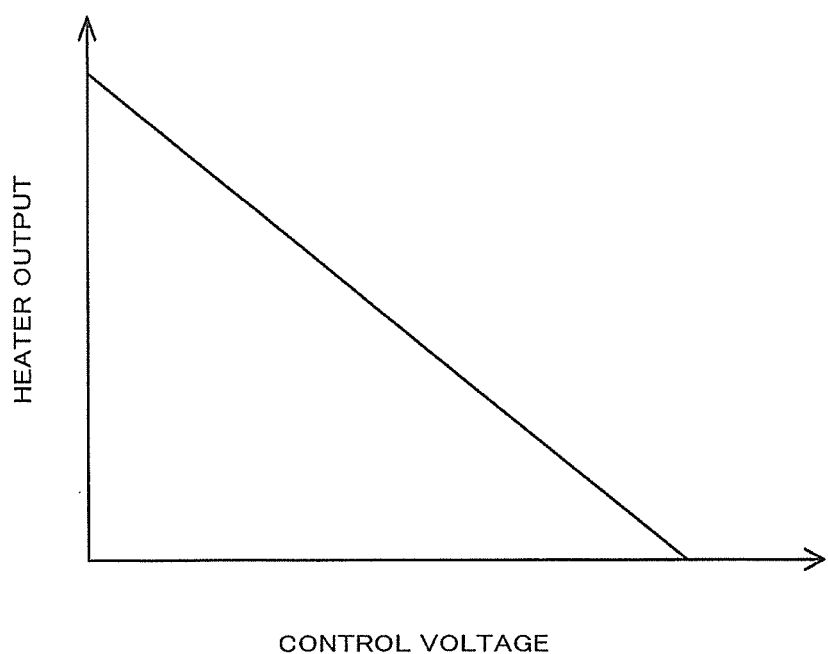
FIG. 4 is a characteristic diagram illustrating a relationship between an output of a heater and a control voltage.

Returning to FIG. 1, the heater 5 includes a first transistor 51 as a PNP-type transistor, a second transistor 52 as an NPN-type transistor, and a power source portion 54. The first transistor 51 and the second transistor 52 are connected in a Darlington configuration. The power source portion 54 supplies a DC voltage to the collector of the latter-stage second transistor 52 through a resistor 53. The control voltage is supplied to the base of the former-stage first transistor 51 in this configuration. FIG. 4 illustrates a relationship between the output of the heater 5 (amount of heat generation) and the control voltage. In the case where the voltage to be supplied to the base of the first transistor 51 (the control voltage) decreases, the current flowing through the first and second transistors 51 and 52 from the power source portion 54 increases. Accordingly, the amount of heat generation in the heater 5 increases. Conversely, in the case where the control voltage increases, the current flowing through the first and second transistors 51 and 52 from the power source portion 54 decreases. Accordingly, the amount of heat generation in the heater 5 decreases.

Figure 5:
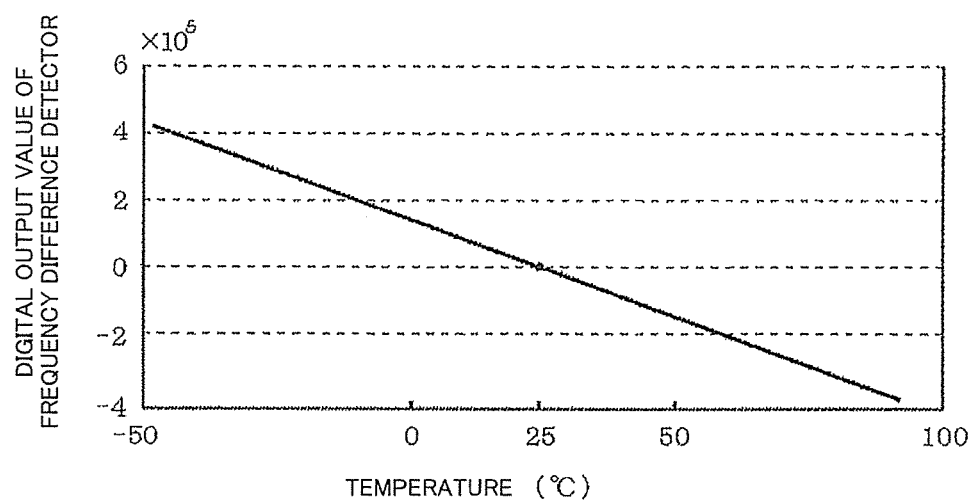
FIG. 5 is a characteristic diagram illustrating a relationship between a digital value, which is an output of a frequency difference detector, and a temperature.

The control voltage is supplied to the base of the first transistor 51 through a voltage supply path 61 from a heater control circuit inside of the IC chip 3. A digital value corresponding to $\{(f2-f1)/f1\}-\{(f2r-f1r)/f1r\}$ is output from the frequency difference detector 31. The relationship between this digital value and temperature is represented as illustrated in FIG. 5. The digital value is equivalent to the temperature detection value, and is added to a digital value corresponding to a temperature target value at an addition unit 62. In the latter stage of the addition unit 62, a loop filter 63, a PWM wave interpolation section 64, and a low-pass filter 65 are disposed. The digital value from the addition unit 62 is integrated at the loop filter 63. A PWM pulse corresponding to this integral value is output from the PWM wave interpolation section 64 for a certain period of time. This pulse is averaged at the low-pass filter 65. Accordingly, an analog voltage corresponding to the digital value from the loop filter 63 is obtained from the low-pass filter 65.

The digital value corresponding to the temperature target value is set to a positive value. The temperature detection value that is a negative value is subtracted from the temperature target value at the addition unit 62. Accordingly, the analog voltage output from the low-pass filter 65 increases along with temperature rise. Therefore, the heater 5 receives the control voltage that increases along with temperature rise. In this example, the addition unit 62, the loop filter 63, the PWM wave interpolation section 64, and the low-pass filter 65 correspond to a heater control circuit 6.

Figure 6:
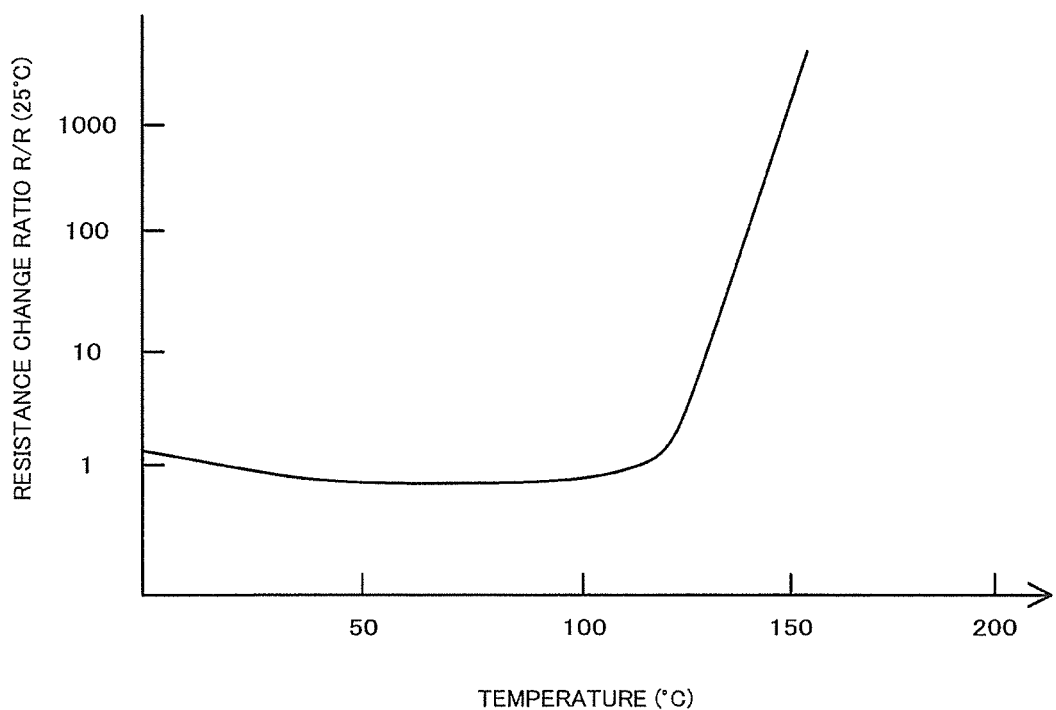
FIG. 6 is a characteristic diagram illustrating a relationship between a temperature and a resistance change ratio of a positive-temperature-coefficient thermistor.

A positive-temperature-coefficient thermistor 71 is interposed in the voltage supply path 61 that is a supply line of the control voltage to the heater 5. A pull-up resistor 73 is disposed between: a point between the positive-temperature-coefficient thermistor 71 and the heater 5, and a direct current power source 72. In this example, the temperature target value for the inside of the container 100 (see FIG. 3) heated by the heater 5 is, for example, 80° C. The temperature-versus-resistance change ratio characteristic of the positive-temperature-coefficient thermistor 71 is represented as illustrated in FIG. 6. The resistance change ratio is a ratio of a resistance value at the current temperature to a resistance value at 25° C. In this example, the positive-temperature-coefficient thermistor 71, the direct current power source 72, and the pull-up resistor 73 constitute an overheat prevention circuit for preventing the heater 5 from overheating when the control voltage is abnormally decreased.

A description will be given of the operation of the above-described embodiment. First, the overall operation will be described. The PLL circuit section 33 operates using the oscillation output of the first oscillation circuit 1 as a clock, so as to obtain the output signal of the oscillation apparatus from the voltage control oscillator 42. The frequency of this output signal is affected by the frequency versus temperature characteristic of the first crystal unit 10. Therefore, the heater 5 is operated to keep the atmosphere where the first crystal unit 10 is placed, for example, at 80° C. The relationship between: the signal corresponding to the oscillation frequency difference between the first crystal unit 10 and the second crystal unit 20, and temperature is the relationship illustrated in FIG. 5, for example. Accordingly, the output of the frequency difference detector 31 is treated as the temperature detection value. Here, in this example, as described above, correction of the frequency setting value is also performed based on the temperature detection value.

The digital value obtained from the frequency difference detector 31 and the temperature target value are added with respective negative and positive signs. An analog voltage corresponding to an integral value of this additional value is supplied to the base of the first transistor 51 of the heater 5 as the control voltage of the heater 5. On the other hand, the digital value obtained by the frequency difference detector 31 is decreased by temperature rise of the atmosphere where the crystal units 10 and 20 are placed (the negative value becomes larger in the negative region). Accordingly, for example, focusing on a time point immediately after turning on the power source of the oscillation apparatus, an operation value from the addition unit 62 is small at the beginning. Therefore, the output value of the loop filter 63 is small and the output value of the heater 5 is large. When the atmosphere temperature is increased by heat generation of the heater 5, the operation value of the addition unit 62 rapidly increases and the output of the loop filter 63 increases.

However, since the characteristic of the heater 5 is, so to speak, a negative control characteristic as illustrated in FIG. 4, the output of the heater 5 becomes larger at the beginning while the amount of heat generation is decreased by increase in control voltage. Accordingly, the increasing rate in atmosphere temperature becomes slow, and the increasing rate in control voltage then becomes low. Finally, the atmosphere temperature settles at a temperature determined with a digital value equivalent to the temperature target value.

Figure 7:
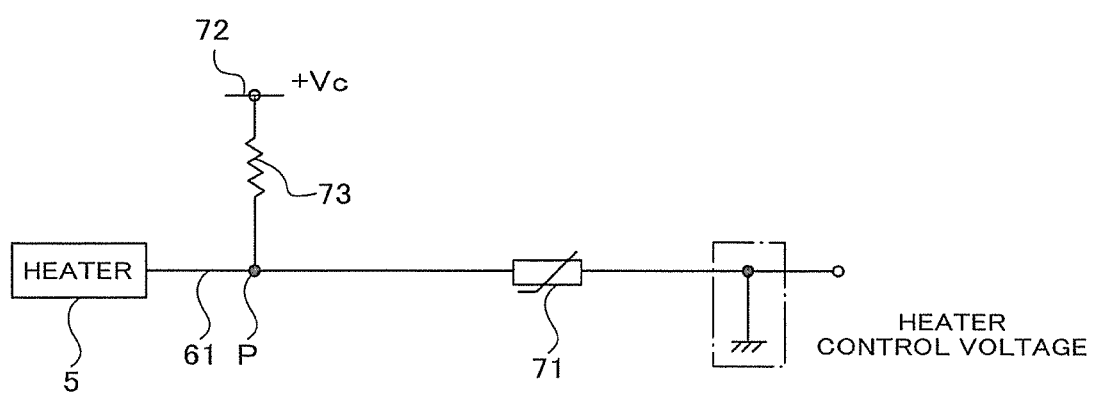
FIG. 7 is an explanatory view for describing an operation of an overheat prevention circuit in the first embodiment.

Here, assume that the control voltage is abnormally decreased by a failure such as disconnection occurring in the IC chip 3, a solder defect, or similar trouble. In the case where, for example, the control voltage becomes zero, the heater control circuit 6 side on the voltage supply path 61 becomes equivalent to a grounded state as illustrated in FIG. 7 (the part surrounded by a chain line). At this time, a voltage at a point P is equal to a voltage (Vc×R71/(R73+R71)) obtained by dividing the voltage Vc of the direct current power source 72 using the pull-up resistor (a resistance value R73) and the positive-temperature-coefficient thermistor 71 (a resistance value R71).

The resistance value of the positive-temperature-coefficient thermistor 71 is small at 80° C. as illustrated in FIG. 6. Therefore, the control voltage becomes smaller than that during the steady state and the output of the heater 5 becomes higher as illustrated in FIG. 4, and thereby the amount of heat generation increases. This increases the atmosphere temperature. After the atmosphere temperature exceeds around 120° C., the resistance value of the positive-temperature-coefficient thermistor 71 rapidly increases. Accordingly, the control voltage becomes larger and the output of the heater becomes lower. This keeps the oscillation apparatus at a lower temperature than a temperature causing burnout, so as to prevent a trouble of equipment due to overheating.

According to the above-described embodiment, an overheat prevention circuit 7 is constituted by the combination of the positive-temperature-coefficient thermistor 71 and the pull-up resistor 73. In the case where the value of the control voltage becomes abnormal, the resistance value of the positive-temperature-coefficient thermistor 71 becomes large along with an increase of heat generation in the heater 5. The control voltage is restricted to the voltage at the connection point between this positive-temperature-coefficient thermistor 71 and the pull-up resistor 73. This provides an effect that prevents overheating of the heater 5 with a simple configuration at low cost.

Second Embodiment

Figure 8:
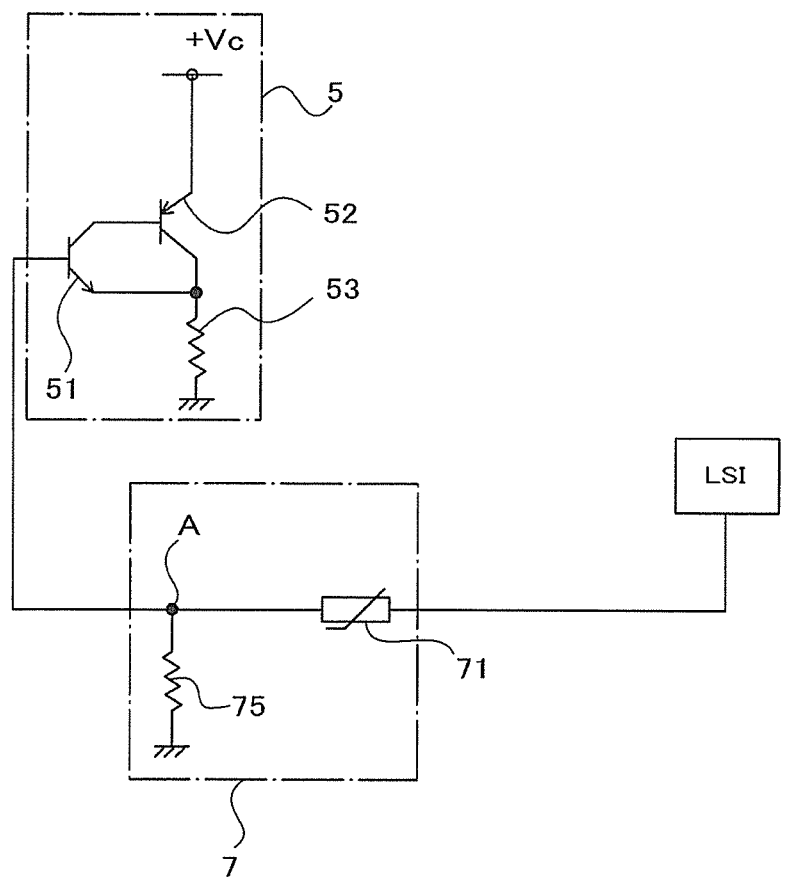
FIG. 8 is a circuit diagram illustrating a main part of a second embodiment disclosed here.

This disclosure is not limited to the heater where its output decreases along with an increase in control voltage. A heater where its output increases along with an increase in control voltage, so to speak, a heater with a positive control characteristic can be used for constituting a similar overheat prevention circuit. FIG. 8 illustrates a main part of an oscillation apparatus using this type of heater 5. This oscillation apparatus employs a configuration where the transistors 51 and 52 are connected in a Darlington configuration. In this case, an increase in base voltage of the transistor 51 increases the current flowing through the transistors 51 and 52, thus increasing the amount of heat generation.

A digital value for a temperature target value to be input to the heater control circuit 6 is set to, for example, a digital value corresponding to 80° C. in the output characteristic of the frequency difference detector 31 illustrated in FIG. 5. Further, the addition unit 62 is constituted such that the temperature target value is subtracted from the output value of the frequency difference detector 31 (the positive and negative signs at the addition unit 62 in FIG. 2 are inverted).

The overheat prevention circuit 7 includes the positive-temperature-coefficient thermistor 71 interposed in the voltage supply path 61, and a pull-down resistor 75. The pull-down resistor 75 is disposed between: a point between the positive-temperature-coefficient thermistor 71 and the heater 5, and the earth.

In the oscillation apparatus with this configuration, the input value of the loop filter 63 decreases along with temperature rise until, for example, the atmosphere temperature reaches 80° C. Therefore, the output value of the frequency difference detector 31 is large immediately after turning on the power source of the oscillation apparatus, and thereby the output value of the loop filter 63 rapidly increases. Since the characteristic of the heater 5 is a positive control characteristic, the amount of heat generation increases due to the rapid increase in control voltage. This decreases the output value of the frequency difference detector 31. Accordingly, the increasing rate of the control voltage becomes slow and the increasing rate of the atmosphere temperature becomes slow, and thereby the atmosphere temperature settles at the temperature target value.

Here, when the control voltage becomes abnormally high due to failure of the IC chip 3 or similar trouble, the output of the heater 5 increases to increase the atmosphere temperature. After the atmosphere temperature exceeds around 120° C., the resistance value of the positive-temperature-coefficient thermistor 71 rapidly increases. The voltage at the point A in FIG. 8 is a voltage determined by a resistance ratio between the positive-temperature-coefficient thermistor 71 and the pull-down resistor 75. This voltage is restricted to a low voltage along with an increase in resistance value of the positive-temperature-coefficient thermistor 71. Accordingly, the second embodiment also provides the effect that prevents overheating of the heater 5 with a simple configuration at low cost.

Here, the frequency difference detector 31 corresponds to a temperature detector. The temperature detector of this disclosure may employ a ratio of the oscillation frequency during measurement to the oscillation frequency at the reference temperature, for example, at 25° C. in one crystal unit, as the temperature detection value, or may generate the temperature detection value based on a thermistor. The heater device of this disclosure is not limited to the oscillation apparatus, and may be applied to, for example, a baking device for substrate in the semiconductor manufacturing field.

According to this disclosure, the heater device includes the heater where its heat generation is controlled with the control voltage from the heater control circuit. This heater device has the configuration where the amount of heat generation increases (decreases) as the control voltage decreases. In this configuration, the positive-temperature-coefficient thermistor and the pull-up resistor (the pull-down resistor) are combined together. When the control voltage abnormally decreases (increases), the resistance value of the positive-temperature-coefficient thermistor increases, and thereby the control voltage is restricted to the voltage at the connection point between the positive-temperature-coefficient thermistor and the pull-up resistor (the pull-down resistor). This prevents overheating of the heater when the value of the control voltage becomes abnormal, with a simple configuration at low cost.

The principles, preferred embodiment and mode of operation of the present disclosure have been described in the foregoing specification. However, the disclosure which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present disclosure. Accordingly, it is expressly intended that all such variations, changes and equivalents which fall within the spirit and scope of the present disclosure as defined in the claims, be embraced thereby.

What is claimed is:

1. A heater device, comprising:
   a temperature detector, configured to detect a temperature of a temperature-controlled object;
   a heater control circuit, configured to output a control voltage based on a temperature detection value of the temperature detector, and a temperature target value;
   a heater, configured to cause heat generation by supply of the control voltage from the heater control circuit, and to provide higher output as the control voltage decreases, so as to heat the temperature of the temperature-controlled object to a target temperature;
   a voltage supply path, configured to supply the control voltage to the heater; and
   an overheat prevention circuit, configured to prevent excessive heat generation of the heater when the heater control circuit becomes abnormal, wherein
   the overheat prevention circuit includes:
      a positive-temperature-coefficient thermistor, being interposed in the voltage supply path in a position heated by the heater; and
      a pull-up resistor, including one end connected between the heater and the positive-temperature-coefficient thermistor, and another end connected to a direct current power source,
   wherein the control voltage to be applied to the heater is restricted to a voltage at a connection point between the positive-temperature-coefficient thermistor and the pull-up resistor, when the control voltage from the heater control circuit abnormally decreases.

2. A heater device, comprising:
   a temperature detector, configured to detect a temperature of a temperature-controlled object;
   a heater control circuit, configured to output a control voltage based on a temperature detection value of the temperature detector, and a temperature target value;
   a heater, configured to cause heat generation by supply of the control voltage from the heater control circuit, and to provide higher output as the control voltage increases, so as to heat the temperature of the temperature-controlled object to a target temperature;
   a voltage supply path, configured to supply the control voltage to the heater; and
   an overheat prevention circuit, configured to prevent excessive heat generation of the heater when the heater control circuit becomes abnormal, wherein
   the overheat prevention circuit includes:
      a positive-temperature-coefficient thermistor, being interposed in the voltage supply path in a position heated by the heater; and a pull-down resistor, including one end connected between the heater and the positive-temperature-coefficient thermistor, and another end that is grounded, wherein the control voltage to be applied to the heater is restricted to a voltage at a connection point between the positive-temperature-coefficient thermistor and the pull-down resistor, when the control voltage from the heater control circuit excessively increases.

3. The heater device according to claim 1, wherein the temperature-controlled object is an atmosphere within a container of an oscillation apparatus using a first piezoelectric resonator and a second piezoelectric resonator disposed within the container, and the temperature detector is configured to output a signal corresponding to a frequency difference between the first piezoelectric resonator and the second piezoelectric resonator, as the temperature detection value.

4. The heater device according to claim 2, wherein the temperature-controlled object is an atmosphere within a container of an oscillation apparatus using a first piezoelectric resonator and a second piezoelectric resonator disposed within the container, and the temperature detector is configured to output a signal corresponding to a frequency difference between the first piezoelectric resonator and the second piezoelectric resonator, as the temperature detection value.

5. An oscillation apparatus, comprising:
the heater device according to claim 1;
a piezoelectric resonator; and
a container, for housing the piezoelectric resonator,
wherein the heater device is configured to control a temperature of the container.

6. An oscillation apparatus, comprising:
the heater device according to claim 2;
a piezoelectric resonator; and
a container, for housing the piezoelectric resonator,
wherein the heater device is configured to control a temperature of the container.

7. An oscillation apparatus, comprising:
the heater device according to claim 3; and
the container, for housing the first piezoelectric resonator and the second piezoelectric resonator,
wherein the heater device is configured to control a temperature of the container.

8. An oscillation apparatus, comprising:
the heater device according to claim 4; and
the container, for housing the first piezoelectric resonator and the second piezoelectric resonator,
wherein the heater device is configured to control a temperature of the container.

* * * * *